(12) United States Patent
Pala

(10) Patent No.: US 11,088,688 B2
(45) Date of Patent: Aug. 10, 2021

(54) CONFIGURATIONS OF COMPOSITE DEVICES COMPRISING OF A NORMALLY-ON FET AND A NORMALLY-OFF FET

(71) Applicant: LogiSiC Devices Inc., Newark, DE (US)

(72) Inventor: Vipindas Pala, San Jose, CA (US)

(73) Assignee: LOGISIC DEVICES, INC., San Jose, CA (US)

( * ) Notice: Subject to any disclaimer, the term of this patent is extended or adjusted under 35 U.S.C. 154(b) by 0 days.

(21) Appl. No.: 16/693,226

(22) Filed: Nov. 23, 2019

(65) Prior Publication Data

US 2020/0259489 A1 Aug. 13, 2020

Related U.S. Application Data

(60) Provisional application No. 62/805,089, filed on Feb. 13, 2019.

(51) Int. Cl.
*H03K 17/567* (2006.01)
*H03K 17/687* (2006.01)
(Continued)

(52) U.S. Cl.
CPC ......... *H03K 17/567* (2013.01); *H01L 27/085* (2013.01); *H01L 29/1608* (2013.01);
(Continued)

(58) Field of Classification Search
CPC .................. H03K 17/567; H03K 17/6871
See application file for complete search history.

(56) References Cited

U.S. PATENT DOCUMENTS 4,518,926 A 5/1985 Swanson
5,610,424 A 3/1997 Park
(Continued)

OTHER PUBLICATIONS

Renato Campana V. et al., "0.5 V Supply Resistorless Voltage Reference for Low Voltage Applications", SBCCI Aug. 31-Sep. 4, 2015, Salvador, Brazil, 2015 ACM. 978-1-4503-3763—Feb. 15, 2008.

(Continued)

*Primary Examiner* — Lincoln D Donovan
*Assistant Examiner* — Colleen J O Toole
(74) *Attorney, Agent, or Firm* — Daylight Law, P.C.

(57) ABSTRACT

The present disclosure describes a composite device including first field effect transistor (FET) device and second FET device. First FET device includes first drain, first source, first gate and shielding terminal. First FET device is made of wide-bandgap semiconductor material. Second FET device includes second drain, second source, and second gate. First and second FET devices are electrically connected in cascode configuration for providing a capacitive path between drain and gate terminals of composite device such that current flowing through gate terminal controls slew rate of drain voltage appearing at drain terminal. Cascode configuration includes an electrical connection of first drain to drain terminal, an electrical connection of first source to second drain, an electrical connection of second gate to first gate and gate terminal, an electrical connection of shielding terminal to second source, and an electrical connection of second source to source terminal of composite device.

18 Claims, 8 Drawing Sheets

(51) Int. Cl.
*H01L 27/085* (2006.01)
*H01L 29/16* (2006.01)
*H01L 29/20* (2006.01)
*H01L 29/778* (2006.01)
*H01L 29/78* (2006.01)

(52) U.S. Cl.
CPC ...... *H01L 29/2003* (2013.01); *H01L 29/7786* (2013.01); *H01L 29/7838* (2013.01); *H03K 17/6871* (2013.01)

(56) References Cited

U.S. PATENT DOCUMENTS

| | | | |
|---|---|---|---|
| 7,018,876 | B2 | 3/2006 | Mathew et al. |
| 7,342,453 | B2 | 3/2008 | Amasuga et al. |
| 7,501,670 | B2 | 3/2009 | Murphy |
| 7,847,638 | B2 | 12/2010 | Ishizuka |
| 8,097,905 | B2 * | 1/2012 | Tsuchiko ............ H01L 29/7813 257/272 |
| 8,183,629 | B2 | 5/2012 | Pattanayak et al. |
| 8,207,523 | B2 | 6/2012 | Tsai et al. |
| 8,847,235 | B2 | 9/2014 | Rose |
| 9,276,569 | B2 * | 3/2016 | Ikeda ............... H01L 25/072 |
| 9,281,305 | B1 | 3/2016 | Yang et al. |
| 9,397,089 | B2 | 7/2016 | Pan et al. |
| 9,472,549 | B2 | 10/2016 | Rose et al. |
| 2007/0046379 | A1 | 3/2007 | Tanahashi et al. |
| 2012/0199849 | A1 | 8/2012 | Tsai et al. |
| 2012/0241756 | A1 | 9/2012 | Zhang et al. |
| 2012/0262220 | A1 | 10/2012 | Springett |
| 2012/0292635 | A1 | 11/2012 | Iketani et al. |
| 2013/0020614 | A1 | 1/2013 | Lu et al. |
| 2014/0091852 | A1 | 4/2014 | Norling et al. |
| 2014/0097701 | A1 | 4/2014 | Bailey et al. |
| 2014/0167100 | A1 * | 6/2014 | Ichikawa ............ H03K 17/168 257/109 |
| 2014/0292287 | A1 | 10/2014 | Rutter et al. |
| 2016/0133627 | A1 | 5/2016 | Hirlir |
| 2017/0025407 | A1 | 1/2017 | Liu et al. |
| 2018/0166557 | A1 | 6/2018 | Padmanabhan et al. |

OTHER PUBLICATIONS

Extended European Search Report dated Sep. 18, 2020 from European Patent Application No. 20156773.2, 13 pages.

* cited by examiner

CONFIGURATIONS OF COMPOSITE DEVICES COMPRISING OF A NORMALLY-ON FET AND A NORMALLY-OFF FET

FIELD OF THE INVENTION

The present disclosure relates to power semiconductor devices, and more particularly, a cascode connection of a normally-on power switch and a normally-off power switch.

BACKGROUND OF THE INVENTION

A cascode switch circuit is a composite circuit including a normally-off FET device and a normally-on FET device connected in a cascode configuration, thereby operating as a normally-off FET semiconductor device. The device has three external terminals such as source, gate, and drain. In general, normally-off FET devices require a gate-to-source voltage bias for substantial current conduction to occur between a drain terminal and a source terminal. Further, normally-on FET devices generate a substantial current between a drain terminal and a source terminal in absence of a gate-to-source voltage bias of the normally-on FET devices.

Generally, in a conventional cascode configuration circuit, there is a lack of control on a slew rate of a drain voltage at a drain terminal of the composite circuit, resulting in excessive ringing, or high electro magnetic interference, which are undesirable for the stability of the system. Further, during switching transition, due to high voltage spike at the drain terminal of the composite circuit, the voltage at a drain terminal of the normally-off FET device may have a value above a safe operating voltage, which also leads to high power dissipation.

Although indirect methods of controlling the slew rate exist, most of these techniques have other drawbacks, including the need for additional circuit components, or having to add extremely large resistances to the gate of the cascode switch circuit, thereby causing additional time delay between the control signal and the switching transition. Therefore, there exists a need for a composite device with such arrangements which ensures controlling of the slew rate of the drain voltage of the composite device in more reliable way and avoiding high voltage at the drain terminal of the normally-off FET device during the switching transition.

SUMMARY OF THE INVENTION

This summary is provided only for the purposes of introducing the concepts presented in a simplified form. This is not intended to identify essential features of the claimed invention or limit the scope of the invention in any manner.

In one embodiment, a composite device is described. The composite device includes a first field effect transistor (FET) device and a second FET device. The first FET device includes a first drain, first source, a first gate and a shielding terminal. The first FET device is made of a wide-bandgap semiconductor material. The second FET device includes a second drain, a second source, and a second gate. The first FET device and the second FET device are electrically connected in a cascode configuration while providing a capacitive path across a drain terminal and a gate terminal of the composite device such that current flowing through the gate terminal controls a slew rate of a drain voltage appearing at the drain terminal. The cascode configuration includes an electrical connection of the first drain to the drain terminal, an electrical connection of the first source to the second drain, an electrical connection of the second gate to the first gate and the gate terminal, and an electrical connection of the second source to a source terminal of the composite device.

In another embodiment, a composite device is described. The composite device includes a normally-on field effect transistor (FET) device and a normally-off FET device. The normally-on FET device includes a first drain, a first source, a first gate, and a shielding terminal. The normally-on FET device is made of a wide-bandgap semiconductor material. The normally-off FET device includes a second drain, a second source, and a second gate. The normally-on FET device and the normally-off FET device are electrically connected in a cascode configuration for providing a capacitive path across a drain terminal and a gate terminal of the composite device such that current flowing through the gate terminal controls a slew rate of a drain voltage appearing at the drain terminal, and minimizing effects at the second drain of a transient voltage spike appearing at the drain terminal during a switching transition. The cascode configuration includes an electrical connection of the first drain to the drain terminal, an electrical connection of the first source to the second drain, an electrical connection of the shielding terminal to the second source, an electrical connection of the second gate to the first gate and the gate terminal, and an electrical connection of the second source to a source terminal of the composite device.

In yet another embodiment, a composite device is described. The composite device includes a normally-on field effect transistor (FET) device and a normally-off FET device. The normally-on FET device includes a first drain, a first source, a first gate, and a shielding terminal. The normally-on FET device is made of a wide-bandgap semiconductor material. The normally-off FET device includes a second drain, a second source, and a second gate. The normally-on FET device and the normally-off FET device are electrically connected in a cascode configuration. The cascode configuration minimizes effects at the second drain of a transient voltage spike appearing at a drain terminal of the composite device during a switching transition. The cascode configuration includes an electrical connection of the first drain to the drain terminal, an electrical connection of the first source to the second drain, an electrical connection of the shielding terminal to the second source, an electrical connection of the second gate to the gate terminal, and an electrical connection of the first gate to the second source and a source terminal of the composite device.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION OF THE INVENTION

In the following detailed description, numerous specific details are set forth in order to provide a thorough understanding of the present technology. However, the present technology may be practiced without these specific details. In other instances, well-known methods, procedures, components, and circuits have not been described in detail so as to not unnecessarily obscure aspects of the exemplary embodiments presented herein. Moreover, it is noted that structures and devices are shown in block diagram form in order to avoid obscuring the disclosure.

Reference in this specification to "one embodiment" or "an embodiment" means that a particular feature, structure, or characteristic described in connection with the embodiment is included in at least one embodiment of the disclosure. The appearance of the phrase "in one embodiment" in various places in the specification is not necessarily all referring to the same embodiment, nor are separate or alternative embodiments mutually exclusive of other embodiments. Moreover, various features are described which may be exhibited by some embodiments and not by others. Similarly, various parameters are described that may be parameters for some embodiments but not for other embodiments.

As used herein, a component of a circuit which is "electrically connected or conductively coupled" to another component or point in the circuit or "electrically connected between" two components or points in a circuit can be either directly connected or indirectly connected to the other component(s) or point(s) in the circuit. A component is directly connected to another component or point in the circuit if there are no intervening components in the connection whereas a component is indirectly connected to another component or point in the circuit if there are one or more intervening components in the connection. If a first component or point in a circuit is specified as being connected to a second component or point in the circuit via a third component, the third component is electrically connected between the first component or point in the circuit and the third component or point in the circuit. The first component or point in a circuit and third component can be directly or indirectly connected together. Similarly, the second component or point in a circuit and third component can be directly or indirectly connected together.

Figure 1:
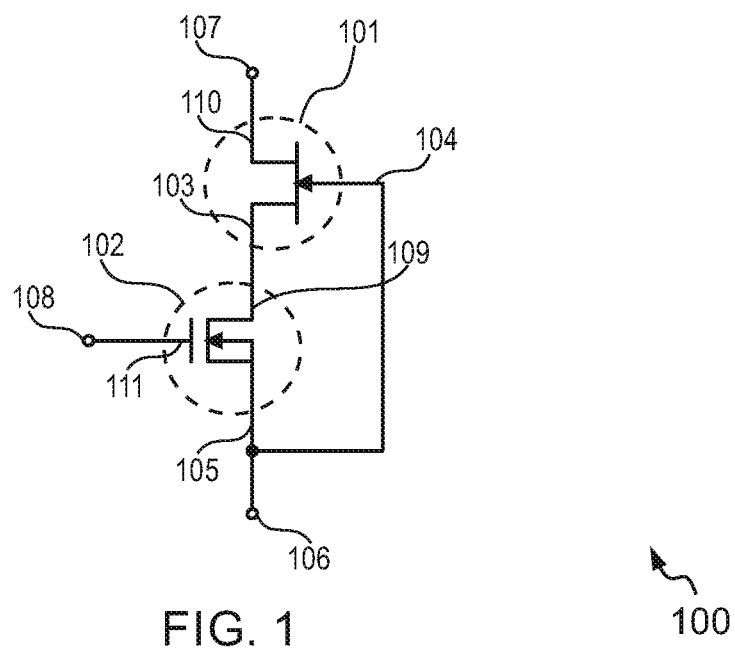
FIG. 1 is a circuit diagram representation of cascode configuration of a conventional cascode configuration circuit.

One commonly used conventional cascode configuration circuit is a cascode configuration circuit 100, as illustrated in FIG. 1 (prior art). The cascode configuration circuit 100 includes two field effect transistors (FETs) devices. The two FET devices are a normally-on FET 101 and a normally-off FET 102. The normally-on FET 101 is connected in series with the normally-off FET 102 and conform to a "Baliga Pair" configuration (hereinafter referred as "cascode configuration").

As shown in FIG. 1, a drain terminal 109 of the normally-off FET 102 is conductively coupled to a source terminal 103 of the normally-on FET 101, and a gate terminal 104 of the normally-on FET 101 is conductively coupled to a source terminal 105 of the normally-off FET 102 or to a fixed bias voltage. A gate terminal 111 of the normally-off FET 102 serves as a gate terminal 108 of the cascode configuration. The source terminal 105 of the normally-off FET 102 serves as a source terminal 106 of the cascode configuration. A drain terminal 110 of the normally-on FET 101 serves as a drain terminal 107 of the cascode configuration.

In general, "normally-on" means a device which conducts current in the absence of gate bias voltage (i.e. voltage difference between gate and source terminals) and requires a gate bias voltage to block a current flow and, "normally-off" means a device which blocks current in the absence of gate bias voltage and conducts current when a gate bias voltage is applied.

When a voltage bias at the gate terminal 108 with respect to the source terminal 106 is at zero potential, the normally-off FET 102 does not conduct a current across the drain terminal 109 and the source terminal 105 due to the zero potential at the gate terminal 111. When a high bias voltage is applied at the drain terminal 107, voltage drop across the gate and source terminals of the normally-on FET 101 becomes negative and forces the normally-on FET 101 to operate in an OFF-state. Hence, the cascode configuration circuit 100 operates in an OFF-state, when the voltage bias at the gate terminal 108 with respect to the source terminal 106 is at the zero potential, which exhibits a normally-off behavior of the cascode configuration circuit 100. Therefore, the cascode configuration circuit 100 in FIG. 1 operates in normally-off mode.

In particular, the cascode configuration is used for obtaining a normally-off behavior out of a normally-on wide bandgap FET by connecting with a normally-off FET incorporating Silicon, or Silicon Germanium. In general, a wide-bandgap FET semiconductor may be defined as a field effect transistor incorporating a semiconducting material that has a bandgap exceeding 1.5 electron Volts, such as Silicon Carbide (SiC), Gallium Nitride (GaN), Aluminum Gallium Nitride (AlGaN), Aluminum Nitride (AlN), Gallium Oxide, Diamond or others. In particular, the normally-on FET 101 may be a Silicon Carbide Junction Field Effect Transistor (JFET), a Silicon Carbide depletion-mode MOSFET or an AlGaN/GaN FET. The normally-off FET 102 may be an enhancement mode Silicon MOSFET or enhancement mode AlGaN/GaN HEMT. Further, the maximum drain voltage rating of the normally-on FET 101 is higher than that of the normally-off FET 102.

Figure 2:
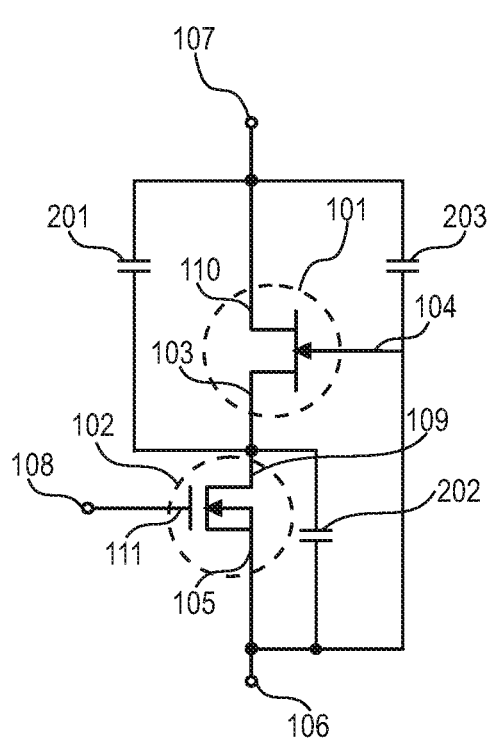
FIG. 2 is a circuit diagram representation depicting internal capacitances of the conventional cascode configuration circuit of FIG. 1.

Referring now to FIG. 2, an exemplary representation depicts the internal capacitances of the normally-on FET 101 and the normally-off FET 102. The internal capacitances of the cascode configuration circuit 100 are a first drain-to-source capacitance 201, a second drain-to-source capacitance 202 and a gate-to-drain capacitance 203. For ease of understanding, the first drain-to-source capacitance 201 is referred to as an output capacitance $C_{DS}$ 201 of the normally-on FET 101 and the second drain-to-source capacitance 202 is referred to as an output capacitance $C_{DS}$ 202 of the normally-off FET 102.

In conventional high voltage FET devices, a slew rate of the drain voltage is controlled by adjusting charging/discharging current through a gate terminal which determines the rate of change of voltage across a gate-to-drain capacitance (hereinafter referred to as 'capacitance $C_{GD}$') of the FET. The capacitance $C_{GD}$ corresponds to Miller capacitance or Miller coupling. However, as shown in FIG. 2, the capacitance $C_{GD}$ 203 of the normally-on FET 101 is connected across the drain voltage (i.e., at the drain terminal 107) and a fixed bias voltage (i.e. at the source terminal 106) and is not charged or discharged by the gate terminal 108. In other words, charging and discharging of the capacitance $C_{GD}$ 203 is independent of current from the gate terminal 108, thereby direct control over slew rate is not easily achieved.

Based on the foregoing, there are two main drawbacks in the cascode configuration circuit 100. It is noted that the gate terminal 108 of the cascode configuration has a limited control over the rate of change of the drain voltage (i.e., slew-rate) during a switching transition. This is because there is no direct capacitive coupling between the gate terminal 108 and the drain terminal 107 of the cascode configuration, which can be charged or discharged by the current flowing through the gate terminal 108 during the switching transition. Therefore, the capacitance $C_{GD}$ 203, electrically connected across the drain terminal 107 and the gate terminal 104, fails to control the rate of change of the drain voltage. As such, lack of control of the slew-rate may result in excessive ringing, or high electro magnetic interference, which is undesirable for the stability of the system.

A second drawback of the cascode configuration circuit 100 is that abnormally high voltages can occur at the source terminal 103 when both the normally-on FET 101 and the normally-off FET 102 are off and the voltage at the drain terminal 107 is on the rise during a transient event. During the transient event, the change in voltage at the source terminal 103 is determined by a capacitor divider across the drain terminal 107 and the source terminal 105, consisting of the output capacitance $C_{DS}$ 201 and the output capacitance $C_{DS}$ 202. The fraction of the drain transient voltage appearing across the drain terminal 109 and the source terminal 105 of the normally-off FET 102 is approximately proportional to the output capacitance $C_{DS}$ 201 divided by the sum of the output capacitance $C_{DS}$ 201 and the output capacitance $C_{DS}$ 202. Therefore, if the output capacitance $C_{DS}$ 201 is not sufficiently low, the voltage at the drain terminal 109 of the normally-off FET 102 rises up to a breakdown voltage of the normally-off FET 102, thereby power dissipation during the switching transition increases and the cascode configuration circuit 100 becomes less reliable or necessitates the use of a normally-off FET 102 with a higher voltage rating than desired.

Various embodiments of the present disclosure provide a composite semiconductor device, comprising a wide bandgap normally-on FET and a normally-off FET. A source terminal of the normally-on FET is conductively coupled to a drain terminal of the normally-off FET, a drain terminal of the normally-on FET configured as a drain terminal of the composite device, and a source terminal of the normally-off FET configured as a source terminal of the composite device. The configuration of the composite device conforms to a cascode configuration which exhibits a normally-off behavior. In addition, the normally-on FET in the composite device has a fourth terminal, henceforth referred to as the shielding terminal, which is capacitively coupled to the drain terminal of the normally-on device, such that at least 50% of the total drain capacitance appears between the drain and the shielding terminal. The shielding terminal of the normally-on FET is conductively coupled to the source terminal of the normally-off FET or to a fixed bias voltage. Further, a gate terminal of the normally-on FET and a gate terminal of the normally-off FET are conductively coupled to a gate terminal of the composite device. The internal gate-to-drain capacitance ($C_{GD}$) of the normally-on FET is coupled between the drain and gate terminals of the composite device. This provides a Miller capacitance across the gate and drain terminals of the composite device, thereby enabling slew rate of drain voltage of the composite device to be directly controlled by current flow from the gate terminal of the composite device during a switching transition.

Figure 3:
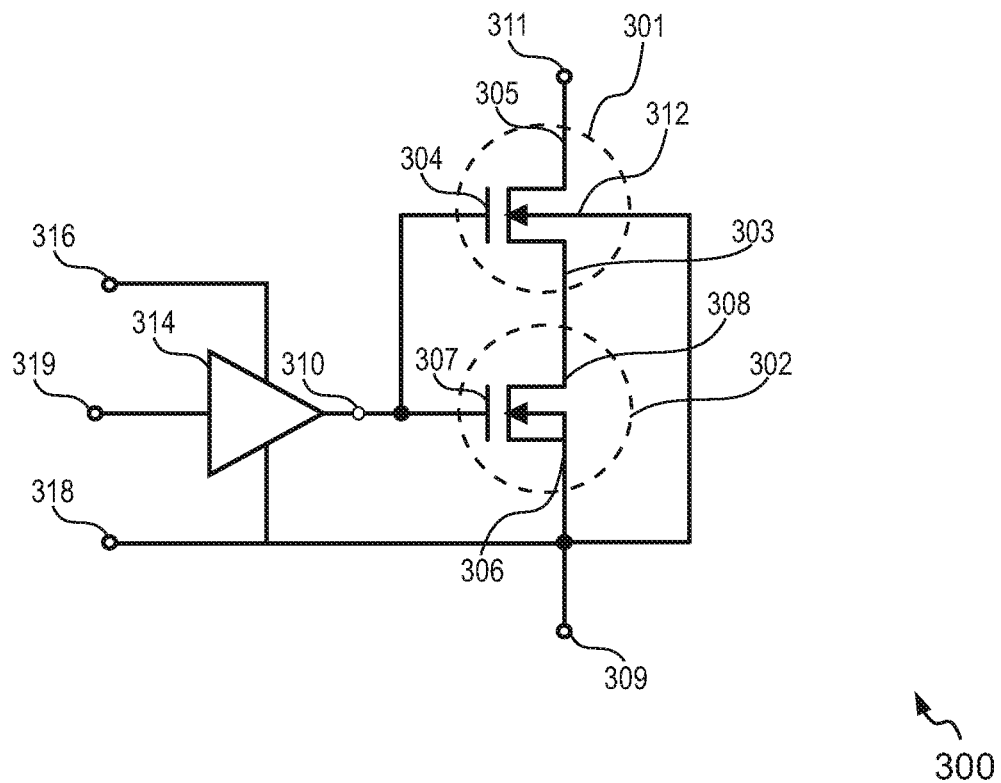
FIG. 3 illustrates a circuit diagram representation of cascode configuration of a composite device, in accordance with an embodiment of the present disclosure.

Referring now to FIG. 3, it illustrates a circuit diagram representation of cascode configuration of a composite device 300, according to an embodiment of the present disclosure. In the depicted embodiment, the composite device 300 is designed using a first FET device 301, and a second FET device 302. In one embodiment, the first FET device 301 is a wide bandgap normally-on FET device and the second FET device 302 is a normally-off FET device. For ease of understanding, the terms "first FET device 301" and "second FET device 302" are hereinafter interchangeably referred to as "normally-on FET 301" and "normally-off FET 302", respectively throughout the description. In one embodiment, the composite device 300 may be designed with components such as, but not limited to, a junction gate field-effect transistor (JFET), a metal oxide silicon field effect transistor (MOSFET), a hetero-junction high electron mobility transistor (HEMT), and a bipolar junction transistor (BJT).

The composite device 300 is provided with a source terminal 309, a gate terminal 310, and a drain terminal 311. The normally-on FET 301 includes a first source 303, a first gate 304, and a first drain 305. The normally-off FET 302 includes a second source 306, a second gate 307, and a second drain 308. The normally-on FET 301 and the normally-off FET 302 are electrically connected in a cascode configuration to provide a normally-off behavior in the composite device 300.

In the cascode configuration, the first source 303 is conductively coupled to the second drain 308. The first gate 304 is conductively coupled to the second gate 307 and corresponds to the gate terminal 310 of the composite device 300. Moreover, the first drain 305 and the second source 306 serve as the drain terminal 311 and the source terminal 309, respectively, of the composite device 300. In addition, the normally-on FET 301 includes a fourth terminal 312 (hereinafter referred to as 'shielding terminal 312') and conductively coupled to the second source 306 and the source terminal 309. As such, the design of the composite device 300 conforms to a cascode configuration. In an alternative embodiment, the shielding terminal 312 is conductively coupled to a fixed bias voltage.

In one embodiment, the normally-on FET 301 may be a wide-bandgap FET and defined as a FET incorporating a semiconducting material with a bandgap energy exceeding 1.5 electron Volts. The semiconducting material may be selected to be a Silicon Carbide (SiC), Gallium Nitride (GaN), Aluminum Gallium Nitride (AlGaN), Aluminum Nitride (AlN), Gallium Oxide, Diamond or any other material as per design requirement. In particular, the normally-on FET 301 may be, but is not limited to, a Silicon Carbide Junction Field Effect Transistor (JFET), a Silicon Carbide depletion-mode MOSFET with a negative threshold voltage or a group-III nitride FET such as an AlGaN/GaN HEMT.

In one embodiment, the normally-off FET 302 may be an enhancement mode Silicon MOSFET or enhancement mode group-III-Nitride high electron mobility transistor (HEMT).

In one embodiment, the normally-off FET 302 may be monolithically integrated with a gate driver circuit 314 that is configured to provide gate-drive signals for the composite device 300. The gate driver circuit 314 may include some known gate driver circuits for controlling gate drive signals in FET devices. In one embodiment, the gate driver circuit 314 may comprise a series of buffers with a voltage bias terminal ($V_{CC}$) 316, a ground terminal 318, and an input terminal 319, that amplifies a signal input and generates a driver input for the composite device 300. In addition, the gate driver circuit 314 may also provide features such as an integrated current sensor, over-voltage protection, over-current protection and under-voltage lock-out to the composite device 300.

It is noted that the material, the structure and the related parameters mentioned above are merely an example. In other embodiments, the normally-on FET 301 and the normally-off FET 302 may be formed by using other material, structures and parameters. For example, the normally-on FET 301 and the normally-off FET 302 can be both nitride-based FETs.

In one embodiment, the normally-on FET 301 is formed on a first substrate and the normally-off FET 302 is formed on a second substrate. The first substrate and the second substrate are packaged in a single package to form the composite device 300. The package includes a metal substrate, a leadframe, a printed circuit board, or the like. With such configurations, the composite device 300 can be fully integrated.

Alternatively, in one embodiment, the normally-on FET 301 and the normally-off FET 302 are monolithically integrated on a same substrate.

Figure 4:
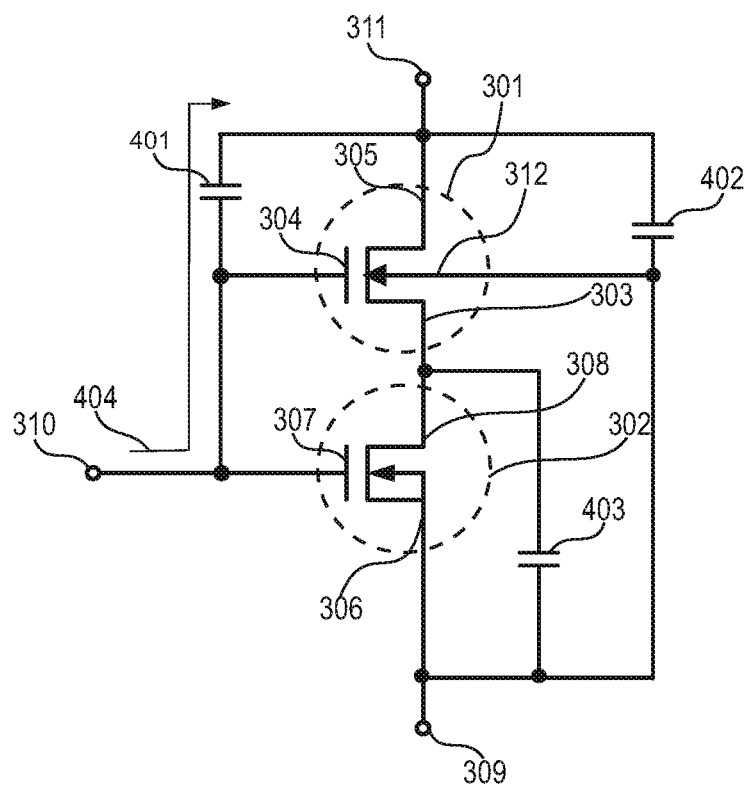
FIG. 4 illustrates a circuit diagram representation depicting internal capacitances of the composite device of FIG. 3, in accordance with an embodiment of the present disclosure.

Some of the merits of the present disclosure may be identified in FIG. 4, the composite device 300 with some of the internal capacitances is shown and explained further in detail.

According to FIG. 4 in conjunction with FIG. 3, the normally-on FET 301 and the normally-off FET 302 of the composite device 300 include the internal capacitances such as an internal gate-to-drain capacitance ($C_{GD}$) 401 of the normally-on FET 301, an internal drain-to-source capacitance ($C_{DS}$) 403 of the normally off FET 302, and an internal drain output capacitance 402 conductively coupled to the shielding terminal 312 of the normally-on FET 301. The internal drain output capacitance 402 corresponds to a portion of total drain capacitance of the normally-on FET 301, such that the internal drain output capacitance 402 represents at least 50% of the total drain capacitance.

The internal gate-to-drain capacitance ($C_{GD}$) 401 of the normally-on FET 301 appears directly across the gate terminal 310 and the drain terminal 311 of the composite device 300, providing a Miller capacitance that can directly control the slew rate of the drain voltage of the drain terminal 311 using charging/discharging current through the gate terminal 310 of the composite device 300. Thus, by connecting the first gate 304 and the gate terminal 310, a capacitive path (see, 404 of FIG. 4) is introduced between the gate terminal 310 and the drain terminal 311 for controlling the slew rate of the drain voltage of the composite device 300. The slew rate of the drain voltage varying with respect to the current from the gate terminal 310 is explained further in detail from FIG. 11 to FIG. 13.

In addition, a significant portion of the total drain output capacitance of normally-on FET 301 (see, 402 of FIG. 4) is now coupled through the shielding terminal 312 to the source terminal 309 of the composite device 300, leading to a reduction in the capacitance appearing across the first drain 305 and the first source 303. This implies that the capacitance divider appearing across the drain terminal 311 and the source terminal 309 of the composite device 300 favors a lower voltage across the second drain 308 and the second source 306 of the normally-off FET 302, reducing a possibility of the normally-off FET 302 going to breakdown when a transient voltage spike appears at the drain terminal 311 of the composite device 300 when both the normally-on FET 301 and the normally-off FET 302 are turned off. In other words, the electrical connection of the shielding terminal 312 to the second source 306 facilitates de-coupling a part of an internal output capacitance associated with the normally-on FET 301 away from the second drain 308 of the normally-off FET 302.

For example, as shown in FIG. 4, the portion of total drain capacitance ($C_{TOTAL}$) is electrically connected between the shielding terminal 312 and the first drain 305. Therefore, a capacitance value across the first drain 305 and the first source 303 of the normally-on FET 301 is reduced as compared to a capacitance value ($C_{DS}$) across the drain terminal 110 and the source terminal 103 of the normally-on FET 101 (referring to FIG. 2). Thus, the electrical connection of the shielding terminal 312 to the second source 306 minimizes effects of a drain transient voltage spike at the second drain 308 during the switching transition.

Figure 8:
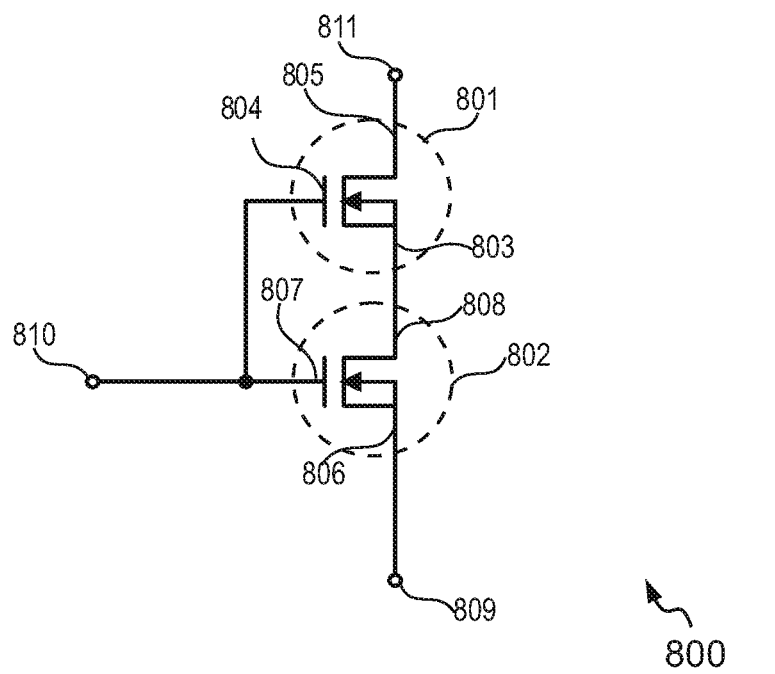
FIG. 8 illustrates a circuit diagram representation of cascode configuration of a composite device, in accordance with another embodiment of the present disclosure.
Figure 9:
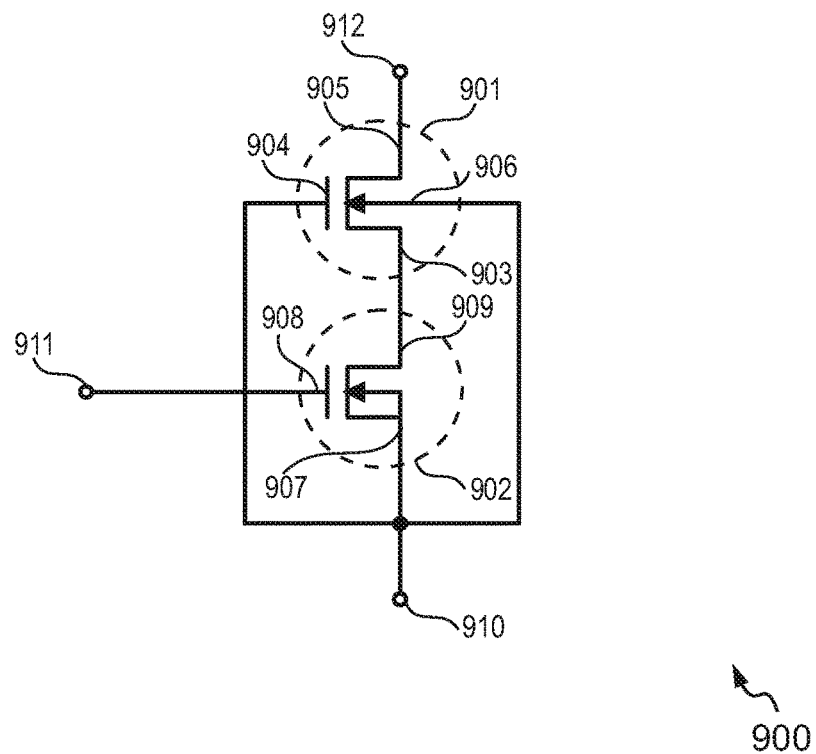
FIG. 9 illustrates a circuit diagram representation of cascode configuration of a composite device, in accordance with another embodiment of the present disclosure.

As illustrated in FIGS. 3 and 4, the present disclosure mainly focuses on two features such as conductively coupling the first gate 304 to the second gate 307 and the gate terminal 310, and conductively coupling the shielding terminal 312 of the normally-on FET 301 to the second source 306 of the normally-off FET 302 or to a fixed bias voltage, may be implemented by themselves rather than in combination, leading to two more configuration for the composite device (as described in FIGS. 8 and 9).

Figure 5:
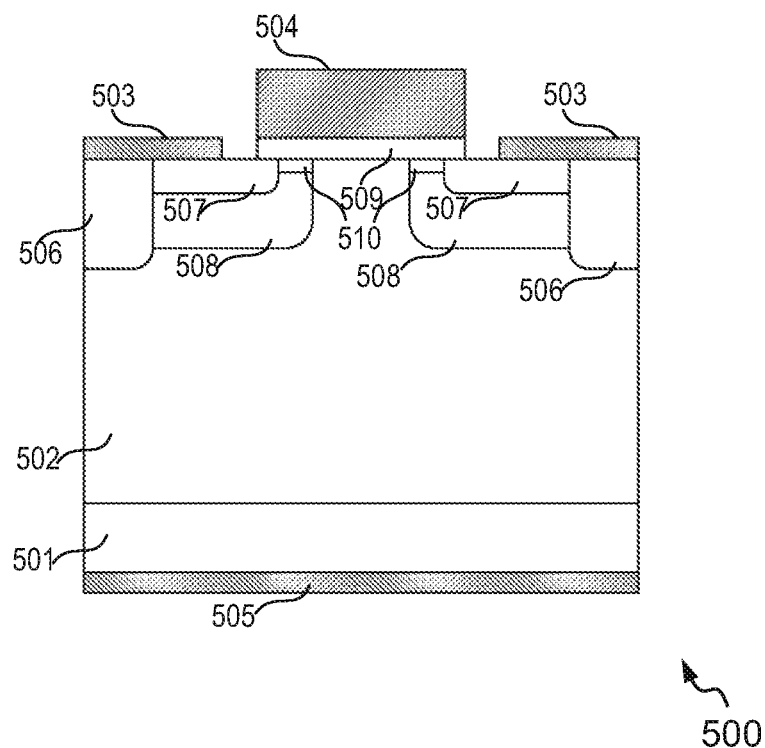
FIG. 5 illustrates a cross-sectional view of a normally-on Silicon Carbide field effect transistor (FET) in the conventional device of FIG. 1.

Referring now to FIG. 5 in conjunction with FIG. 1 (prior-art), a cross-sectional view of a depletion mode Silicon carbide MOSFET 500 (hereinafter referred as 'MOSFET 500') of the normally-on FET 101 is illustrated. The normally-on FET 101 may be formed by a plurality of unit-cells, and some structural elements. The normally-on FET 101 includes the gate terminal 104, the drain terminal 107 and the source terminal 103 corresponding to a gate electrode 504, a drain electrode 505 and a source electrode 503, respectively, of the MOSFET 500. The MOSFET 500 includes a substrate layer 501 and an epitaxial layer 502. In one example, the substrate layer 501 and the epitaxial layer 502 may be fabricated by using materials such as Silicon Carbide material of a first conductivity type or any other materials as per feasibility and requirements. A base region 506 of a second conductivity type is configured within the epitaxial layer 502 and electrically coupled to the source electrode 503. A body region 508 of the second conductivity type is formed within the epitaxial layer 502 and is conductively coupled to the base region 506.

A source region 507 of the first conductivity type, enclosed within the body region 508, is electrically coupled to the source electrode 503. The source region 507 forms a P-N junction with the body region 508. Further, the MOSFET 500 includes a gate oxide region 509 partially overlapping with the source region 507, the body region 508 and the gate electrode 504. The MOSFET 500 may also include a buried channel region 510 of the first conductivity type, partially overlapping with the gate oxide region 509 and the body region 508. The buried channel region 510 may be fabricated with an appropriate doping concentration and thickness so that a conducting path is formed from the source electrode 503 to the drain electrode 505 via the source region 507 and the buried channel region 510 when the voltage bias between the gate electrode 504 and source electrode 503 is zero volts.

In this configuration, a significant fraction of output capacitance (not shown in Figures) at the drain electrode 505 is conductively coupled to the body region 508 and the base region 506. However, the body region 508 and the base region 506 are conductively coupled to the source electrode which results in the fraction of the output capacitance appearing across the source electrode 503 and the drain electrode 505. Alternatively, the output capacitance $C_{DS}$ 201 of the normally-on FET 101 included in the cascode configuration circuit 100 (as shown in FIG. 2) acts as one element in a capacitor divider across the drain electrode 505 and the source electrode 503.

Figure 6:
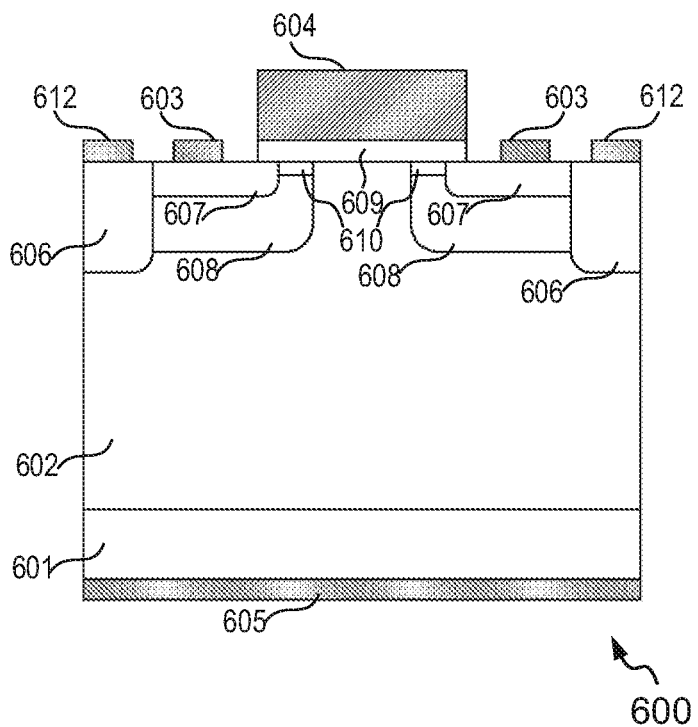
FIG. 6 illustrates a cross-sectional view of a normally-on Silicon Carbide depletion mode MOSFET in the composite device of FIG. 3, in accordance with an embodiment of the present disclosure.

Referring now to FIG. 6 in one exemplary embodiment of the present disclosure, it illustrates a cross-sectional view of a depletion mode Silicon Carbide MOSFET 600 (hereinafter referred to as 'MOSFET 600') of the normally-on FET 301 in the composite device 300 (referring to FIG. 3).

In the exemplary embodiment, the normally-on FET 301 including the first gate 304, the first drain 305 and the first source 303 correspond to a gate electrode 604, a drain electrode 605, and a source electrode 603, respectively. In addition, the shielding terminal 312 of the normally-on FET 301 corresponds to a shielding electrode 612 of the MOSFET 600. As shown in FIG. 6, the MOSFET 600 includes a substrate layer 601 and an epitaxial layer 602. In one example implementation, the substrate layer 601 and the epitaxial layer 602 may be fabricated by using materials such as Silicon Carbide material of the first conductivity type. A base region 606 of the second conductivity type is formed inside the epitaxial layer 602 and electrically coupled to the shielding electrode 612. A body region 608 of the second conductivity type is also formed within the epitaxial layer 602 and is conductively coupled to the base region 606. A source region 607 of the first conductivity type, enclosed within the body region 608, is electrically coupled to the source electrode 603. The source region 607 forms a P-N junction with the body region 608.

When the P-N junction is reverse biased between the source region 607 and the body region 608, the P-N junction serves to isolate the shielding electrode 612 and the source electrode 603. The MOSFET 600 further includes a gate oxide region 609 partially overlapping both the source region 607, the body region 608 and the gate electrode 604. The MOSFET 600 may also include a buried channel region 610 of the first conductivity type, partially overlapping the gate oxide region 609 and the body region 608.

In one configuration, the buried channel region 610 may be fabricated with an appropriate doping concentration and thickness so that a conducting path is formed from the source electrode 603 to the drain electrode 605 via the source region 607 and the buried channel region 610 when the voltage bias between the gate electrode 604 and source electrode 603 is zero volts.

In one embodiment, a significant fraction of a total drain capacitance (not shown in figures) at the drain electrode 605 is conductively coupled to the body region 608, the base region 606 and the shielding electrode 612. For instance, if the shielding electrode 612 is conductively coupled to the source terminal 309 of the composite device 300, the fraction of the total drain capacitance coupled to the body region 608 and the base region 606 does not appear across the first drain 305 and the first source 303 of the normally-on FET 301. As a result, the drain-to-source capacitance of the normally-on FET 301 is reduced so that when a transient voltage spike occurs at the drain terminal 311 of the composite device 300, a smaller fraction of the drain voltage appears at the second drain 308 of the normally-off FET 302, thereby improving the stability and reliability of the composite device 300.

Figure 7:
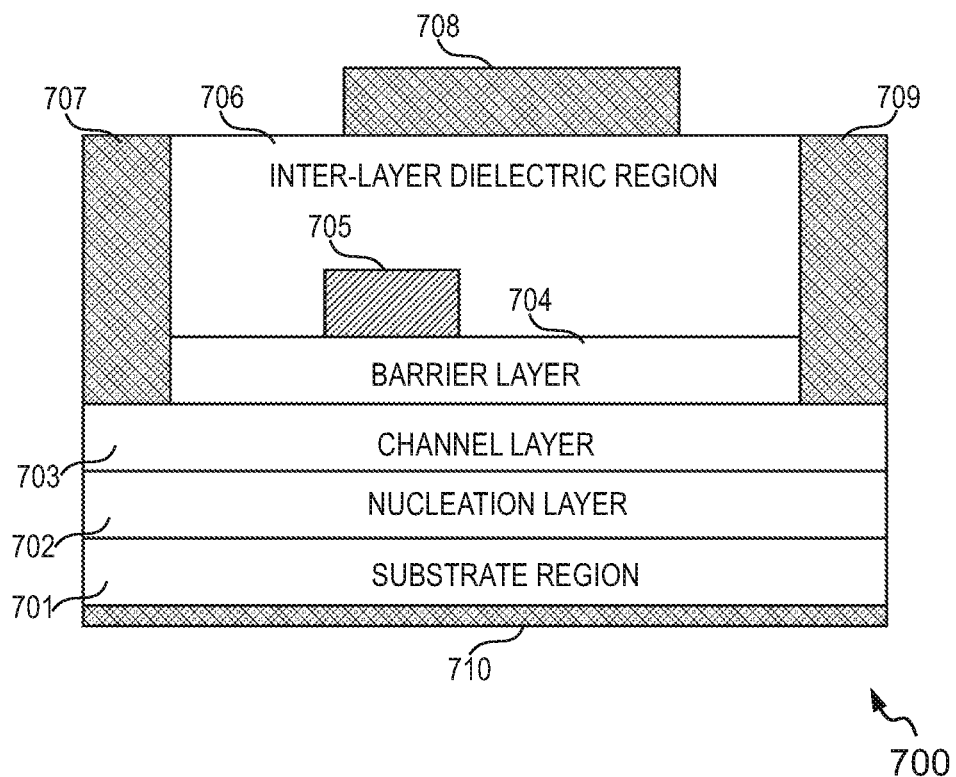
FIG. 7 illustrates a cross-sectional view of a group-III nitride FET of the normally-on FET device in the composite device of FIG. 3, in accordance with an embodiment of the present disclosure.

Referring now to FIG. 7, it illustrates a cross-sectional view of a group-III nitride FET 700 (hereinafter referred to as 'FET 700') of the normally-on FET 301 in the composite device 300, according to an embodiment of the present disclosure.

In the depicted embodiment, the FET 700 includes a substrate electrode 710 conductively coupled to a substrate region 701. In one embodiment, the substrate region 701 may be formed of Silicon Carbide, Silicon, Sapphire, Gallium Nitride or any other material capable of supporting growth of a group III-Nitride material. The FET 700 includes a nucleation layer 702 comprising a suitable material to relieve stress due to lattice mismatch between the substrate region 701 and a channel layer 703. Moreover, the channel layer 703 is formed of a group III-Nitride material. A barrier layer 704 of a group III-Nitride material is formed on a top of the channel layer 703 such that there is a possibility of a 2-dimensional (2D) electron gas formation in the channel layer 703. The FET 700 further includes a gate electrode 705 formed on a top of the barrier layer 704. A source electrode 707 and a drain electrode 709 are conductively coupled to the 2D electron gas in the channel layer 703. Further, an inter-layer dielectric region 706 may be formed on the top of the barrier layer 704. The FET 700 may include a field plate electrode 708, which is formed such that the field plate electrode is isolated from the gate electrode 705, the source electrode 707 and the drain electrode 709 by a portion of the inter-layer dielectric region 706.

For instance, the FET 700 when used as a normally-on FET 301 in the composite device 300, the gate electrode 705, the source electrode 707, and the drain electrode 709 of the FET 700 correspond to the first gate 304, the first source 303 and the first drain 305 respectively of the normally-on FET 301. Further, the field plate electrode 708 and the substrate electrode 710 are capacitively coupled to the drain electrode 709 and isolated from the other electrodes of the FET 700. In one embodiment, either one of the field plate electrode 708 or the substrate electrode 710 or in combination may correspond to the shielding terminal 312 of the normally-on FET 301.

FIG. 8 in one exemplary embodiment of the present disclosure, illustrates a circuit diagram representation of cascode configuration of a composite device 800. The composite device 800 includes a normally-on FET 801 and a normally-off FET 802 which present equivalent characteristics as of the normally-on FET 301 and the normally-off FET 302 of the composite device 300 as explained above. Further, the composite device 800 may be designed with components such as, but not limited to, a junction gate field-effect transistor (JFET), a metal oxide silicon field effect transistor (MOSFET), a hetero-junction high electron mobility transistor (HEMT), and a bipolar junction transistor (BJT).

In the embodiment, a second drain 808 of the normally-off FET 802 is conductively coupled to a first source 803 of the normally-on FET 801, a first gate 804 of the normally-on FET 801 is conductively coupled to a second gate 807 of the normally-off FET 802 and corresponds to a gate terminal 810 of the composite device 800. Moreover, a first drain 805 of the normally-on FET 801 and a second source 806 of the normally-off FET 802 correspond to a drain terminal 811 and a source terminal 809, respectively, of the composite device 800.

In addition, an internal gate-to-drain capacitance ($C_{GD}$) of the normally-on FET 801 (not shown in figures) is conductively coupled across the gate terminal 810 and the drain terminal 811 of the composite device 800. The internal gate-to-drain capacitance ($C_{GD}$) corresponds to a Miller capacitance and facilitates direct controlling of a slew rate of a drain voltage by regulating a current through the gate terminal 810 of the composite device 800 as explained with reference to FIG. 4.

The normally-on FET 801 may be a wide-bandgap FET, which may be defined as a FET incorporating a semiconducting material that has a bandgap exceeding 1.5 electron Volts, such as Silicon Carbide (SiC), Gallium Nitride (GaN), Aluminum Gallium Nitride (AlGaN), Aluminum Nitride (AlN), Gallium Oxide, Diamond or others. In particular, the normally-on FET 801 may be a Silicon Carbide Junction Field Effect Transistor (JFET), a Silicon Carbide depletion-mode MOSFET or a group-III nitride FET such as a AlGaN/GaN HEMT, and the normally-off FET 802 may be an enhancement mode Silicon MOSFET or enhancement mode group-III nitride HEMT.

In some embodiments, the normally-off FET 802 may be monolithically integrated with a gate driver circuit (not shown in figure) that provides gate-drive signals for the composite device 800. The gate driver circuit may include some known gate driver circuits for controlling gate drive signals in FET devices. The gate driver may comprise a series of buffers with a voltage bias terminal ($V_{CC}$), a ground terminal, and an input terminal that amplifies a signal input and generates a driver input for the composite device 800. In addition, the gate driver circuit may also provide features such as an integrated current sensor, over-voltage protection, over-current protection and under-voltage lock-out to the composite device 800.

In some embodiments, the normally-on FET 801 is formed on a first substrate and the normally-off FET 802 is formed on a second substrate. The first substrate and the second substrate are packaged in a single package to form the composite device 800. The package includes a metal substrate, a leadframe, a printed circuit board, or the like. With such configurations, the composite device 800 can be fully integrated.

Alternatively, in some embodiments, the normally-on FET 801 and the normally-off FET 802 are monolithically integrated on a same substrate.

Referring now to FIG. 9 in one exemplary embodiment of the present disclosure, it illustrates a circuit diagram representation of cascode configuration of a composite device 900. The composite device 900 includes a normally-on FET 901 and a normally-off FET 902 presenting equivalent characteristics as of the normally-on FET 301 and the normally-off FET 302 of the composite device 300 as explained above.

In the embodiment, a second drain 909 of the normally-off FET 902 is conductively coupled to a first source 903 of the normally-on FET 901. A first gate 904 of the normally-on FET 901 is conductively coupled to a second source 907 of the normally-off FET 902. Alternatively, in one embodiment, the first gate 904 of the normally-on FET 901 may be conductively coupled to a fixed bias voltage. Moreover, a first drain 905 of the normally-on FET 901, a second gate 908 and a second source 907 of the normally-off FET 902 corresponds to a drain terminal 912, a gate terminal 911 and a source terminal 910 respectively of the composite device 900. Further, the normally-on FET 901 includes a shielding terminal 906 conductively coupled to the second source 907 of the normally-off FET 902 and the source terminal 910 of the composite device 900. As such, a portion of the total drain capacitance may be conductively coupled to the source terminal 910 of the composite device 900 via the shielding terminal 906, leading to a reduction in the capacitance appearing across the first drain 905 and the first source 903. This implies that the capacitance divider appearing across the drain terminal 912 and the source terminal 910 of the composite device 900 favors a lower voltage across the second drain 909 and the second source 907 of the normally-off FET 902, reducing the possibility of the normally-off FET 902 going to breakdown when a voltage transient spike appears at the drain terminal 912 of the composite device when both the normally-on FET 901 and the normally-off FET 902 are turned off.

The normally-on FET 901 may be a wide-bandgap FET, which may be defined as a field effect transistor incorporating a semiconducting material that has a bandgap exceeding 1.5 electron Volts, such as Silicon Carbide (SiC), Gallium Nitride (GaN), Aluminum Gallium Nitride (AlGaN), Aluminum Nitride (AlN), Gallium Oxide, Diamond or others. In particular, the normally-on FET 901 may be a Silicon Carbide Junction Field Effect Transistor (JFET), a Silicon Carbide depletion-mode MOSFET or a group-III nitride FET such as a AlGaN/GaN HEMT, and the normally-off FET 902 may be an enhancement mode Silicon MOSFET or enhancement mode group-III nitride HEMT. In some embodiments, the normally-off FET 902 may be monolithically integrated with a gate driver circuit (not shown in figure) that provides gate-drive signals for the composite device 900. The gate driver circuit may include some known gate driver circuits for controlling gate drive signals in FET devices. The gate driver circuit may comprise a series of buffers with a voltage bias terminal ($V_{CC}$), a ground terminal and an input terminal that amplifies a signal input and generates a driver input for the composite device 900. In addition, the gate driver circuit may also provide features such as an integrated current sensor, over-voltage protection, over-current protection and under-voltage lock-out to the composite device 900.

In one embodiment, the normally-on FET 901 is formed on a first substrate and the normally-off FET 902 is formed on a second substrate. The first substrate and the second substrate are packaged in a single package to form the composite device 900. The package includes a metal substrate, a leadframe, a printed circuit board, or the like. With such configurations, the composite device 900 can be fully integrated.

Alternatively, in one embodiment, the normally-on FET 901 and the normally-off FET 902 are monolithically integrated on a same substrate.

Figure 10:
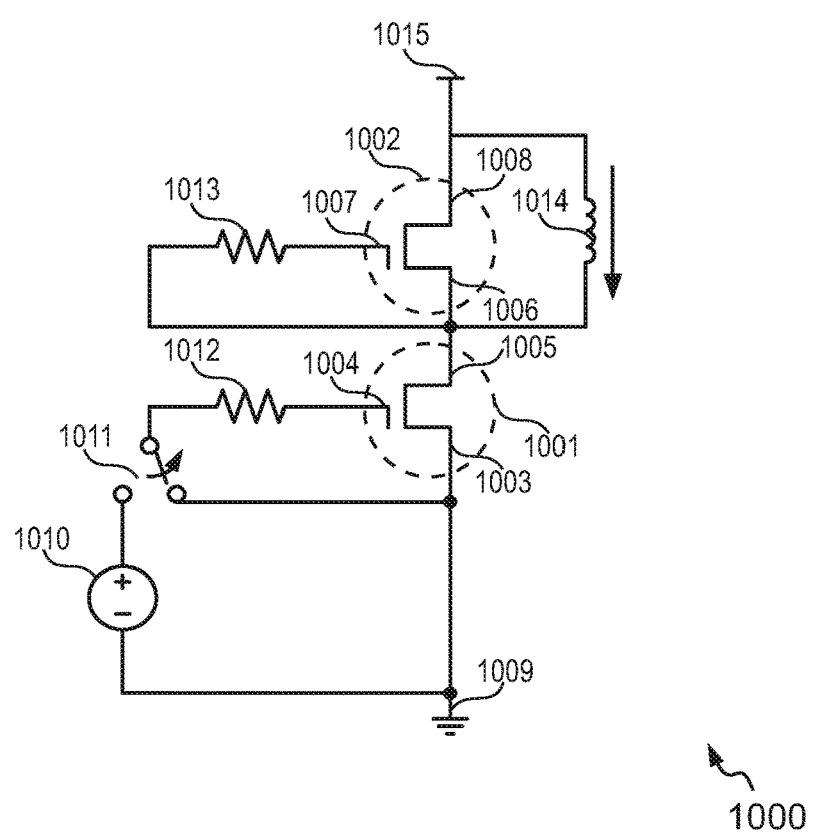
FIG. 10 illustrates a circuit diagram representation depicting two composite devices connected in a half-bridge configuration, in accordance with an embodiment of the present disclosure.

Referring now to FIG. 10 in one exemplary embodiment of the present disclosure, it illustrates a circuit diagram representation of a circuit 1000 including two composite devices connected in a half-bridge configuration. The two composite devices are a composite device 1001 and a composite device 1002. The performance advantages of the present disclosure may be demonstrated using the circuit 1000.

The composite devices 1001 and 1002 may be a normally-off composite FET comprising a normally-on Silicon Carbide depletion mode MOSFET with a maximum drain voltage rating of 600 volts and a normally-off Silicon MOSFET with a maximum drain voltage rating of 30 V and requiring a gate voltage of 10 V to be fully ON. As shown in FIG. 10, the composite device 1001 is configured as a low-side switch and the composite device 1002 is configured as a rectifier. The composite device 1001 includes a source terminal 1003, a gate terminal 1004 and a drain terminal 1005. The composite device 1002 includes a source terminal 1006, a gate terminal 1007 and a drain terminal 1008. Further, a resistor 1012 and a resistor 1013 are conductively coupled to the gate terminal 1004 and second gate terminal 1007 respectively. The resistor 1012 and the resistor 1013 are configured for controlling maximum charging/discharging current through the gate terminal 1004 and the gate terminal 1007, respectively. As shown in the FIG. 10, a gate supply voltage 1010 is connected at the low side switch or the composite device 1001 and set to 10V. A toggle switch 1011 is conductively coupled between the composite device 1001 and the gate supply voltage 1010. The toggle switch 1011 is configured to turn on or turn off the composite device 1001 by connecting or disconnecting respectively with the gate supply voltage 1010.

Furthermore, the circuit 1000 includes an inductor 1014 electrically connected across the drain terminal 1008 and the source terminal 1006 of the composite device 1002 and a supply voltage 1015 set at 400V is electrically connected to the drain terminal 1008 of the composite device 1002. The source terminal 1003 of the composite device 1001 is electrically connected to a ground voltage 1009 set at zero volts.

Figure 11:
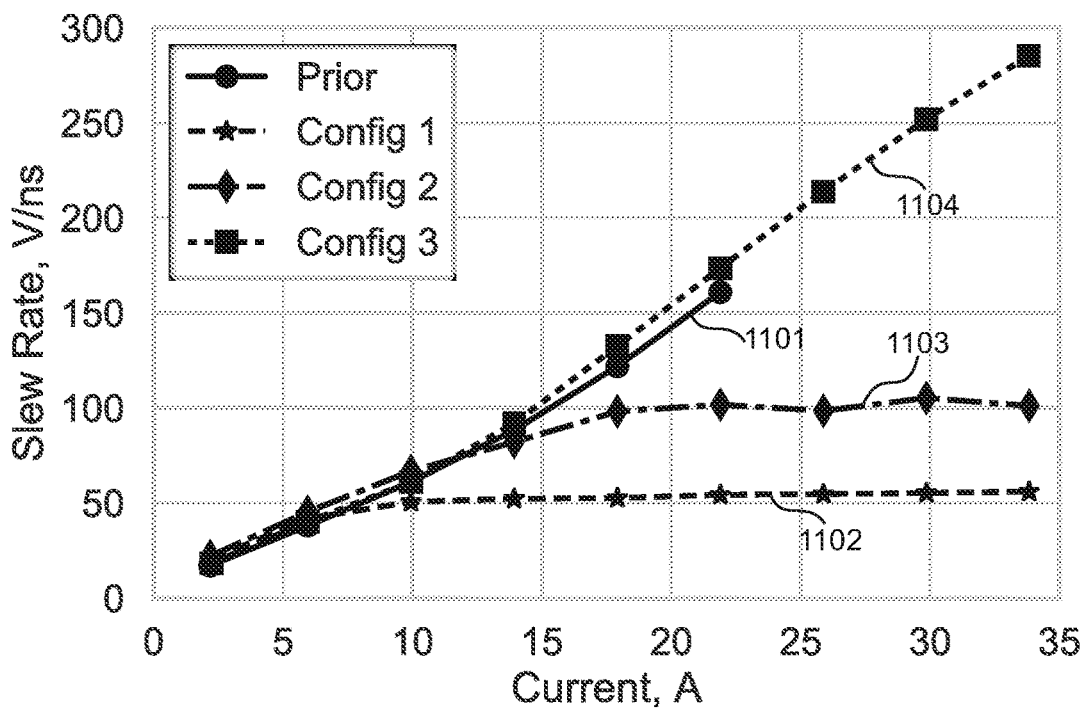
FIG. 11 illustrates a graph depicting variation of a slew rate of the composite device due to current from an inductor of the half-bridge configuration of FIG. 10, in accordance with an embodiment of the present disclosure.

FIG. 11 illustrates a graph depicting variation of a slew rate of a composite device due to current from an inductor of the half-bridge configuration (as shown in FIG. 10). In one example, the slew rate of the drain voltage at the first drain terminal 1005 of the composite device 1001 is plotted against the current through the inductor 1014 when the composite device 1001 is turned off by throwing the toggle switch 1011 and the gate resistors 1012 and 1013 are set to 5 Ohms. Graph 1101 represents the case when the composite devices 1001 and 1002 are configured according to a structure as shown in FIG. 1. Graph 1102 represents the case when the composite devices 1001 and 1002 are configured according to a structure as shown in FIG. 3. Graph 1103 represents the case when the composite devices 1001 and 1002 are configured according to a structure as shown in FIG. 8. Graph 1104 represents the case when the devices 1001, 1002 are configured according to a structure as shown in FIG. 9.

In the case of graphs 1101 and 1103, the construction of the normally-on Silicon Carbide MOSFET included in the composite devices 1001 and 1002 is similar to that described in FIG. 5 and in the case of graphs 1102 and 1104, the construction of the normally-on Silicon Carbide MOSFET included in the composite device is similar to that described in FIG. 6 such that it has a shielding terminal.

As shown in FIG. 11, there is a considerable difference of the slew rate (Volt/ns) values verses the inductor current when the inductor current is increasing, as shown by the graphs 1102 and 1103, respectively, in comparison with the graph 1101, associated with the conventional cascode configuration circuit 100.

In the graphs 1102 and 1103, the maximum slew rate is limited and independent of the inductor current once it crosses a certain threshold value. In contrast, in graphs 1101 and 1104, an increasing trend of the slew rate with respect to the inductor current is depicted. The ability to limit the slew rate independent of the inductor current demonstrates an efficacy of the configurations presented in FIGS. 3 and 8.

Referring back to FIG. 3, the conductively coupling of the first gate 304 of the normally-on FET 301 to the second gate 307 of the normally-off FET 302 and to the gate terminal 310 of the composite device 300 respectively, provides a capacitive path to the gate terminal 310 for limiting the slew rate of the drain voltage at the drain terminal 311 of the composite device 300 through the presence of a Miller capacitance.

Similarly, referring back to FIG. 8, the conductively coupling of the first gate 804 of the normally-on FET 801 to the second gate 807 of the normally-off FET 802 and to the gate terminal 810 of the composite device 800 respectively, provide a means to limit the slew rate of the drain voltage at the drain terminal 811 of the composite device 800 through the presence of a Miller capacitance.

Therefore, the slew rate of the voltage at the drain terminal of the composite device is being controlled through the current flowing through the gate terminal of the composite device.

Figure 12:
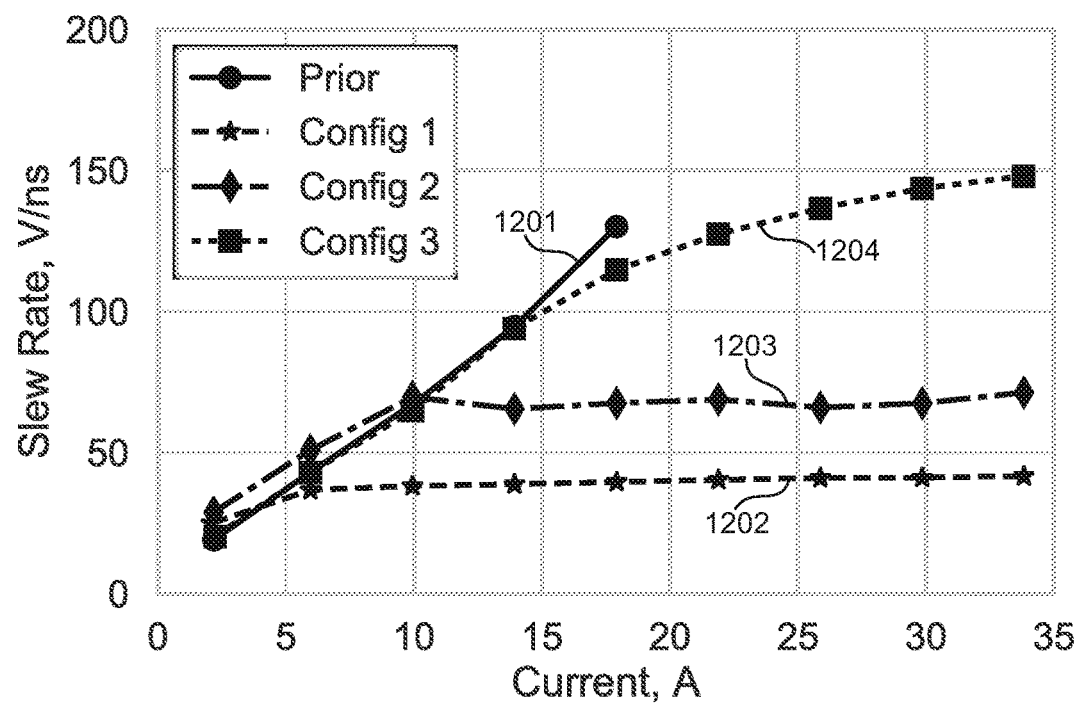
FIG. 12 illustrates a graph depicting variation of a slew rate of the composite device due to current from an inductor of the half-bridge configuration of FIG. 10, in accordance with an embodiment of the present disclosure.

Referring now to FIG. 12 in conjunction with FIG. 10, a graph depicting variation of the slew rate of the composite device due to current from an inductor of the half-bridge configuration is illustrated. As illustrated in FIG. 12, the slew rate of the drain voltage at the first drain terminal 1005 of the composite device 1001 is plotted against the current through the inductor 1014 when the composite device 1001 is turned off by throwing the toggle switch 1011 and the gate resistors 1012 and 1013 are set to 10 Ohms. Graph 1201 represents the case when the composite devices 1001 and 1002 are configured according to the structure as shown in FIG. 1. Graph 1202 represents the case when the composite devices 1001 and 1002 are configured according to the structure as shown in FIG. 3. Graph 1203 represents the case when the composite devices 1001 and 1002 are configured according to the structure as shown in FIG. 8. Graph 1204 represents the case when the composite devices 1001 and 1002 are configured according to the structure as shown in FIG. 9. The graphs 1201 and 1203 have similar construction of the normally-on Silicon Carbide MOSFET included in the composite devices 1001 and 1002 to the structure described in FIG. 5. The graphs 1202 and 1204 have similar construction of the normally-on Silicon Carbide MOSFET included in the composite devices 1001 and 1002 to that described in FIG. 6 such that it has a shielding terminal.

In the example shown in FIG. 12 for graphs 1201 and 1203, similar to the trend in FIG. 11, it is noted that the maximum slew rate is limited, and independent of the inductor current once it crosses a certain threshold value. However, graphs 1201 and 1204 show an increasing trend of the slew rate with respect to the inductor current. Further, the slew rate limit for both graphs 1202 and 1203 is lower than that in the graphs 1102 and 1103 respectively, suggesting that the maximum slew rate can be adjusted by changing a gate resistor of the composite device 1001.

This demonstrates the efficacy of the cascode configurations presented in FIG. 3 and FIG. 8 whereby conductively coupling the first gates 304 or 804 of the normally-on FET to the second gates 307 or 807 of the normally-off FET and to the gate terminals 310 or 810 of the composite device respectively, can provide a means to limit the slew rate of the voltage at the drain 311 or 811 by adjusting the gate resistor.

Figure 13:
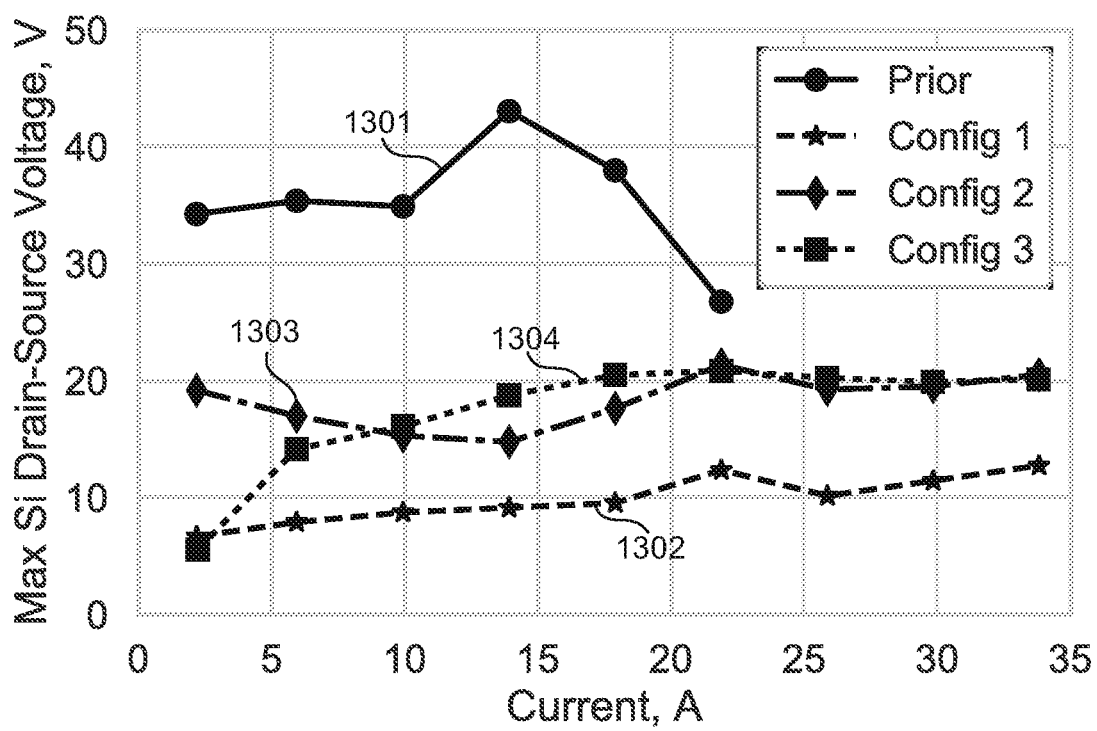
FIG. 13 illustrates a graph depicting variation of a maximum drain voltage at a drain terminal of a normally-off FET device comprised in the composite device due to current from an inductor of the half-bridge configuration of FIG. 10, in accordance with an embodiment of the present disclosure.

Referring now to FIG. 13 in conjunction with FIG. 10, it illustrates a plot of a maximum voltage value reached across the drain terminal and the source terminal of the normally-off FET device included in the composite device 1001 against current through the inductor 1014 when the composite device 1001 is turned off by throwing the toggle switch 1011. The gate resistors 1012 and 1013 are set to 5 Ohms. Graph 1301 represents the case when the composite devices 1001 and 1002 are configured according to a structure as shown in FIG. 1. Graph 1302 represents the case when the composite devices 1001 and 1002 are configured according to a structure as shown in FIG. 3. Graph 1303 represents the case when the composite devices 1001 and 1002 are configured according to a structure as shown in FIG. 8. Graph 1304 represents the case when the composite devices 1001 and 1002 are configured according to a structure as shown in FIG. 9. The graphs 1301 and 1303 have similar construction of the normally-on Silicon Carbide MOSFET included in the composite devices 1001 and 1002 to the structure as described in FIG. 5. The graphs 1302 and 1304 have similar construction of the normally-on Silicon Carbide MOSFET included in the composite devices 1001 and 1002 to the structure as described in FIG. 6 such that it has a shielding terminal.

As shown in FIG. 13, the graphs 1302 and 1304 demonstrate the efficacy of the arrangement or electrical connection (as shown in FIGS. 3 and 9) to limit the drain voltage at the drain terminal of the normally-off FET device included in the composite device 1001 and thereby improving the stability and reliability of the system. The graph 1301 represents the case of the prior art (e.g. as shown in FIG. 1), where the slew rate is not limited as shown in the graph 1101 of FIG. 11 and the output capacitance of normally-on FET is approximately fully coupled to the source terminal of the normally-on FET. In this case, the drain voltage at the normally-off FET (i.e. 109 of FIG. 1) can rise to the highest value. The graph 1302 represents the case where the slew rate is limited to the lowest value as shown in graph 1102 of FIG. 11, and also a portion of the drain capacitance of the drain terminal of the normally-on FET 301 is coupled to the second source terminal of the composite device 1002 using a separate shielding terminal 312. Therefore, according to FIG. 13, the rise of drain voltage at the drain terminal 308 of the normally-off FET 302 is also the lowest.

The graph 1303 represents an intermediate case where the slew rate is limited to an intermediate value as shown in graph 1103 of FIG. 11, but the output capacitance of the normally-on FET is approximately fully coupled to the source of the normally-on FET. In the aforementioned case, according to FIG. 8, the rise of voltage at the drain terminal 808 of the normally-off FET 802 is limited only by way of limiting the rate of the change of voltage at the drain terminal 811 of the composite device 800.

The graph 1304 represents an intermediate case where the slew rate is not limited as shown in the graph 1104 of FIG. 11, but a portion of the capacitance of the drain terminal of the normally-on FET 901 is coupled to the source of the composite device 1001 using a separate shielding terminal 906, thereby limiting the rise of the source voltage to a lower value than shown in graph 1301.

Figure 14:
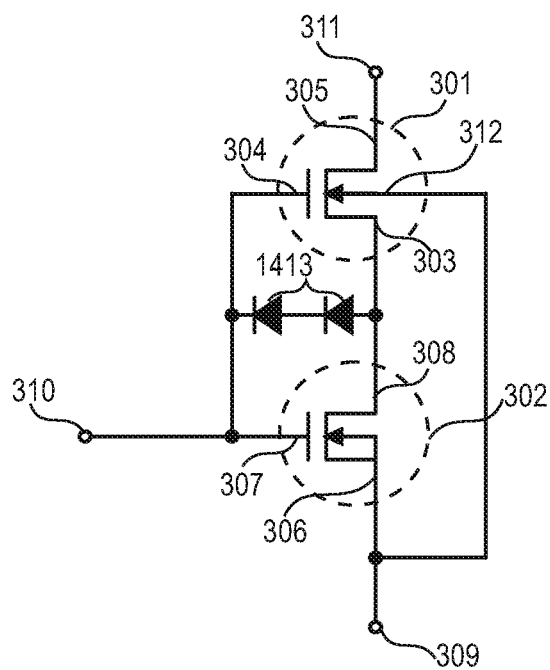
FIG. 14 illustrates a circuit diagram representation depicting a protective element electrically connected to the composite device of FIG. 3, in accordance with an embodiment of the present disclosure.

Referring now to FIG. 14, it illustrates a circuit diagram representation depicting a protective element 1413 electrically connected to the composite device 300, according to an exemplary embodiment of the present disclosure. As shown in the FIG. 14, the protective element 1413 is electrically coupled across the first source 303 and the first gate 304 of the normally-on FET 301. The protective element 1413 is designed to limit a magnitude of negative bias voltage between the first gate 304 and the first source 303 of the normally-on FET 301. The function of the protective element 1413 is as follows: when a voltage at the drain terminal 311 of the composite device 300 is a high value, for example during a switching transition, or during standby mode, and the voltage at node (at the gate terminal 310) is zero or negative, the normally-on FET 301 and the normally-off FET 302 are off, the voltage at the first source 303 can rise to a high value beyond the safe limit for the normally-on FET 301. In that scenario, the protective element is designed to trigger "ON" when a bias voltage between the first source 303 and the first gate 304 rises above a pinch-off voltage of normally-on FET 301, but less than the safe limit for the first gate of the normally-on FET 301. When the protective element is triggered "ON", the voltage at the gate terminal 310 of the composite device and the voltage at the second gate 307 of the normally-off FET 302 also rise. Consequently, the path between the second drain 308 and the second source 306 of the normally-off FET 302 becomes more conductive, which reduces the voltage at the first source 303 of the normally-on FET 301, in a self-limiting manner.

In one embodiment, the protective element 1413 includes two diodes connected in a series connection such that an anode terminal of a diode is conductively coupled with a cathode terminal of another diode. In another embodiment, the protective element may be a Zener diode. In yet another embodiment, the protective element may incorporate a wide bandgap semiconductor.

In one embodiment, the protective element 1413 may be monolithically integrated with the wide-bandgap normally-on FET 301 on the same semiconductor substrate. In another embodiment, the protective element 1413 may be monolithically integrated with the normally-off FET 302 on the same semiconductor substrate. In other embodiments, protective elements 1413 may be monolithically integrated with the normally-off FET 302 and the gate driver circuit 314 that provides gate-drive signals for the composite device 300.

Figure 15:
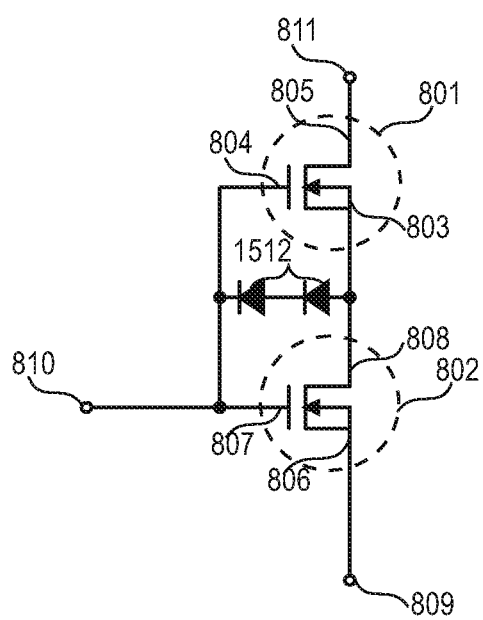
FIG. 15 illustrates a circuit diagram representation depicting a protective element electrically connected to the composite device of FIG. 8, in accordance with an embodiment of the present disclosure.

Referring now to FIG. 15, it illustrates a circuit diagram representation depicting a protective element 1512 electrically connected to the composite device 800 (referring to FIG. 8), according to an exemplary embodiment of the present disclosure. The protective element 1512 also includes a similar structure and a similar functionality as described for the protective element 1413. Therefore, for the sake of brevity, the protective element 1512 is not described herein in detail.

Although the present technology has been described with reference to specific exemplary embodiments, it is noted that various modifications and changes may be made to these embodiments without departing from the broad spirit and scope of the present technology.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Also, techniques, subsystems and methods described and illustrated in the various embodiments as discrete or separate may be combined or integrated with other systems, modules, techniques, or methods without departing from the scope of the present technology. Other items shown or discussed as directly coupled or connected with one another, or as directly communicating with each other, may be communicatively associated through some interface or device, such that the items may no longer be considered directly coupled or connected with one another, or directly communicating with each other, but may still be indirectly communicatively associated and in communication, whether electrically, mechanically, or otherwise, with one another. Other examples of changes, substitutions, and alterations ascertainable by one skilled in the art, upon studying the exemplary embodiments disclosed herein, may be made without departing from the spirit and scope of the present technology.

It should be noted that reference throughout this specification to features, advantages, or similar language does not imply that all of the features and advantages should be or are in any single embodiment. Rather, language referring to the features and advantages may be understood to mean that a specific feature, advantage, or characteristic described in connection with an embodiment may be included in at least one embodiment of the present technology. Thus, discussions of the features and advantages, and similar language, throughout this specification may, but do not necessarily, refer to the same embodiment. Various embodiments of the present disclosure, as discussed above, may be practiced with steps and/or operations in a different order, and/or with hardware elements in configurations which are different than those which are disclosed. Therefore, although the technology has been described based upon these exemplary embodiments, it is noted that certain modifications, variations, and alternative constructions may be apparent and well within the spirit and scope of the technology.

Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A composite device, comprising:
a first field effect transistor (FET) device formed on a first substrate and comprising a first drain, a first gate, a first source, and a shielding terminal, wherein the shielding terminal is conductively coupled to an internal drain output capacitance, wherein the internal drain output capacitance represents at least fifty percent of a total drain capacitance of the first FET device, and wherein the first FET device is made of a wide-bandgap semiconductor material; and
a second field effect transistor (FET) device formed on a second substrate and comprising a second drain, a second gate, and a second source, the first FET device connected with the second FET device in a cascode configuration for providing a capacitive path across a drain terminal and a gate terminal of the composite device such that current flowing through the gate terminal controls a slew rate of a drain voltage appearing at the drain terminal during a switching transition, the cascode configuration comprising:
an electrical connection of the first drain to the drain terminal,
an electrical connection of the first source to the second drain,
an electrical connection of the second gate to the first gate and the gate terminal, and
an electrical connection of the second source to a source terminal of the composite device; and
an electrical connection of the shielding terminal to the second source, wherein the electrical connection of the shielding terminal to the second source: (i) conductively couples the shielding terminal on the first substrate to the second source on the second substrate; and (ii) reduces a drain-to-source capacitance of the first FET device.

2. The composite device as claimed in claim 1, wherein the electrical connection of the shielding terminal to the second source facilitates de-coupling a part of an internal output capacitance associated with the first FET device away from the second drain of the second FET device.

3. The composite device as claimed in claim 1, wherein the gate terminal of the composite device and the first gate are electrically connected such that an internal gate-to-drain capacitance associated with the first FET device provides a direct capacitive coupling between the drain terminal and the gate terminal of the composite device, and wherein the direct capacitive coupling enables controlling of the slew rate of the drain voltage using the current flowing through the gate terminal of the composite device during the switching transition.

4. The composite device as claimed in claim 1, further comprising: a protective element connected between the first gate and the first source, wherein the protective element is configured to limit a magnitude of negative bias voltage between the first gate and the first source when a high voltage appears at the drain terminal of the composite device.

5. The composite device as claimed in claim 1, wherein the first FET device is a normally-on FET device and the second FET device is a normally-off FET device, and wherein the first FET device is a Silicon Carbide (SiC) depletion mode MOSFET.

6. The composite device as claimed in claim 1, wherein the first substrate and the second substrate are packaged in a package.

7. The composite device as claimed in claim 1, further comprising a gate driver circuit, which is monolithically integrated with the second FET device on the second substrate.

8. A composite device, comprising:

a normally-on field effect transistor (FET) device formed on a first substrate and comprising a first drain, a first gate, a first source and a shielding terminal, wherein the shielding terminal is conductively coupled to an internal drain output capacitance, wherein the internal drain output capacitance represents at least fifty percent of a total drain capacitance of the normally-on FET device, and wherein the normally-on FET device is made of a wide-bandgap semiconductor material; and a normally-off field effect transistor (FET) device formed on a second substrate and comprising a second drain, a second gate, and a second source, the normally-on FET device connected with the normally-off FET device in a cascode configuration for providing a capacitive path across a drain terminal and a gate terminal associated with the composite device such that current flowing through the gate terminal controls a slew rate of a drain voltage appearing at the drain terminal, and minimizing effects at the second drain of a transient voltage spike appearing at the drain terminal during a switching transition, the cascode configuration comprising:

an electrical connection of the first drain to the drain terminal, an electrical connection of the first source to the second drain, an electrical connection of the second gate to the first gate and the gate terminal of the composite device, and an electrical connection of the second source to a source terminal of the composite device; and an electrical connection of the shielding terminal to the second source, wherein the electrical connection of the shielding terminal to the second source: (i) conductively couples the shielding terminal on the first substrate to the second source on the second substrate; and (ii) reduces a drain-to-source capacitance of the normally-on FET device.

9. The composite device as claimed in claim 8, wherein the gate terminal of the composite device and the first gate of the normally-on FET device are electrically connected such that an internal gate-to-drain capacitance associated with the normally-on FET device provides a direct capacitive coupling between the drain terminal and the gate terminal of the composite device, and wherein the direct capacitive coupling enables controlling of the slew rate of the drain voltage using the current flowing through the gate terminal of the composite device during the switching transition.

10. The composite device as claimed in claim 8, wherein the electrical connection of the shielding terminal to the second source facilitates de-coupling a fraction of the internal drain output capacitance associated with the normally-on FET device away from the second drain of the normally-off FET device.

11. The composite device as claimed in claim 8, further comprising: a protective element connected between the first gate and the first source, wherein the protective element is configured to limit a magnitude of negative bias voltage between the first gate and the first source when a high voltage appears at the drain terminal of the composite device.

12. The composite device as claimed in claim 8, wherein the normally-on FET device is a Silicon Carbide (SiC) depletion mode MOSFET.

13. The composite device as claimed in claim 8, wherein the first substrate and the second substrate are packaged in a package.

14. The composite device as claimed in claim 8, further comprising a gate driver circuit which is monolithically integrated with the normally-off FET device on the second substrate.

15. A composite device, comprising:

a normally-on field effect transistor (FET) device formed on a first substrate and comprising a first drain, a first gate, a first source, and a shielding terminal, wherein the shielding terminal is conductively coupled to an internal drain output capacitance, wherein the internal drain output capacitance represents at least fifty percent of a total drain capacitance of the normally-on FET device, and wherein the normally-on FET device is made of a wide-bandgap semiconductor material; and a normally-off field effect transistor (FET) device formed on a second substrate and comprising a second drain, a second gate, and a second source, the normally-on FET device connected with the normally-off FET device in a cascode configuration for minimizing effects at the second drain of a transient voltage spike appearing at a drain terminal of the composite device during a switching transition, the cascode configuration comprising:

an electrical connection of the first drain to the drain terminal, an electrical connection of the first source to the second drain, an electrical connection of the second gate to the first gate and a gate terminal of the composite device, and an electrical connection of the second source to a source terminal of the composite device; and an electrical connection of the shielding terminal to the second source, wherein the electrical connection of the shielding terminal to the second source: (i) conductively couples the shielding terminal on the first substrate to the second source on the second substrate; and
(ii) reduces a drain-to-source capacitance of the normally-on FET device.

16. The composite device as claimed in claim 15, wherein the electrical connection of the shielding terminal to the second source facilitates de-coupling a part of the internal output drain capacitance associated with the normally-on FET device away from the second drain of the normally-off FET device.

17. The composite device as claimed in claim 15, wherein the normally-on FET device is a Silicon Carbide (SiC) depletion mode MOSFET.

18. The composite device as claimed in claim 15, wherein the first substrate and the second substrate are packaged in a package.

* * * * *